United States Patent [19]

Masuda et al.

[11] Patent Number: 5,663,035

[45] Date of Patent: Sep. 2, 1997

[54] RADIATION-SENSITIVE MIXTURE COMPRISING A BASIC IODONIUM COMPOUND

[75] Inventors: Seiya Masuda; Munirathna Padmanaban; Takanori Kudo; Yoshiaki Kinoshita; Natsumi Suehiro; Yuko Nozaki; Hiroshi Okazaki, all of Saitama, Japan; Klaus Jürgen Przybilla, Frankfurt, Germany

[73] Assignee: Hoechst Japan Limited, Tokyo, Japan

[21] Appl. No.: 420,787

[22] Filed: Apr. 12, 1995

[30] Foreign Application Priority Data

Apr. 13, 1994 [JP] Japan ...................... 6-075000

[51] Int. Cl.$^6$ ........................................ G03F 7/039
[52] U.S. Cl. .................. 430/270.1; 430/156; 430/170; 430/271.1
[58] Field of Search ................... 430/270.1, 170, 430/191, 189, 156, 271.1

[56] References Cited

U.S. PATENT DOCUMENTS 4,491,628  1/1985  Ito et al. ........................ 430/176
4,789,619  12/1988  Ruckert et al. ................. 430/270

OTHER PUBLICATIONS

Roeschert et al., "Critical Process Parameters Of An Acetal Based Deep UV Photoresist", *Advances in Resist Technology And Processing IX*, vol. 1672:33–45, (1992).
MacDonald et al., "Airborne Chemical Contamination of a Chemically Amplified Resist", *Advances in Resist Technology And Processing VIII*, vol. 1466:2–13, (1991).

Schlegel et al., "Determination of Acid Diffusion in Chemical Amplification Positive a Deep–UV Resists", *Japanese Journal of Applied Physics*, vol. 30, No. 11B, pp. 3132–3137, (1991).
Nakamura et al., "Effect of Acid Diffusion on Resolution Of a Chemically Amplified Resist in X–Ray Lithography", *Japanese Journal of Applied Physics*, vol. 30, No. 10, pp. 2619–2625, (1991).
Crivello, "Applications of Photoinitiated Cationic Polymerization Toward The Development of New Photoresists", *General Electric Corporation Research and Development Center Schenectady*, pp. 65–69.
Crivello, "Cationic Polymerization—Iodonium And Sulfonium Salt Photoinitiators", *Advances in Polymer Science*, vol. 62:1–48, (1984).

*Primary Examiner*—John S. Chu
*Attorney, Agent, or Firm*—Foley & Lardner

[57] ABSTRACT

A radiation-sensitive mixture for use in the production of semiconductor elements, which has high sensitivity and high resolution, which can be developed by an aqueous alkaline solution, and which is based on a novel concept in that a stable acid latent image is controlled by using a radiation-decomposable base.

The mixture is characterized by comprising as essential components a) a binder which is insoluble in water but soluble in an aqueous alkaline solution; $b^1$) a compound having at least one bond which can be cleaved by an acid, or $b^2$) a compound having at least one bond which is crosslinked with the compound a) by an acid; c) a compound which generates an acid when irradiated; and d) a basic iodonium compound.

16 Claims, No Drawings

RADIATION-SENSITIVE MIXTURE COMPRISING A BASIC IODONIUM COMPOUND

BACKGROUND OF THE INVENTION

The present invention relates to a resist material sensitive to activation rays. More particularly, the present invention relates to a radiation-sensitive mixture for use in the production of semiconductor elements and masks, having high sensitivity and high resolution, capable of being applied to a method useful for the formation of both positive and negative patterns, in which an acid generated by the irradiation of KrF excimer laser beams, in particular, X-rays or electron beams is chemically controlled.

Radiation-sensitive mixtures are conventionally known in themselves. In particular, a positive-type mixture has been commercially used as a resist material containing o-quinonediazide and a binder soluble in an aqueous alkaline solution, such as poly(4-hydroxystyrene) or novolac. However, such a system has insufficient sensitivity and resolving power to radiation, in particular, short-wavelength radiation. Since novolac has a high intrinsic absorption in the UV-2 region (220–300 nm), it is unsuitable as a binder which is used in a single-layer resist material to be exposed to deep UV light (220–300 nm). In contrast, poly (hydroxystyrene) (PHS) is characterized by having more advantageous absorption characteristics in the UV region, higher thermal stability and higher resistance to dry etching.

A positive-type radiation-sensitive mixture for UV-2 in which PHS is used as a binder having a side group sensitive to an acid is known by, for example, U.S. Pat. No. 4,491,628. Further, it is also known that the radiation sensitivity of a radiation-sensitive mixture is enhanced when a compound capable of discharging, by the action of radiation, an acid which has a catalytic action on the secondary reaction is added to the mixture. Examples of the compound which produces a strong acid by the action of radiation include diazonium salts, phosphonium salts, sulfonium salts, iodonium salts, nitrobenzyl esters, phenolic methanesulfonates, diazo compounds, halogen compounds, bissulfonylmethane compounds and bissulfonyldiazomethane compounds.

In the paper "Important Process Parameters in Acetal Deep UV Photoresists" ("Progress in Technique and Treatment of Resists IX" edited by Anthony E. November, Proc. SPIE 1672, 33–45 (1992)), H. Reschelt, et al. describe a positive-type radiation-sensitive mixture which contains a PHS copolymer, a compound capable of generating an acid, and an O-acetal-type oligomerization inhibitor. This photosensitive mixture has a shortcoming in that it is extremely sensitive to the non-stableness of an acid latent image. The problem of an unstable acid latent image is an essential problem for a novel resist material which fulfills its function according to the principle of chemical amplification. This problem has been fully discussed in some technical literatures, for example, "Airborne Chemical Contaminants for Chemically-Amplified Resists" by S. A. MacDonald, et al. ("Progress in Technique and Treatment of Resists VIII" edited by Hiroshi Ito, Proc. SPIE 1466, 2–12 (1991)). L. Shlegel presents, in his studies, a problem of diffusion in chemically-amplified resist materials (L. Shlegel, et al., Jap. Journ. of Applied Physics Series 5, presentation at the International Conference on Micro Process in 1991, pp. 175–180). The mean moving range of an acid which acts as a catalyst is equal to the size of a pattern to be resolved in a resist for 240 nm, having high resolving power. In Jap. Journ. of Applied Physics (Vol. 30, No. 10, October, 1991, pp. 2619–2625), J. Nakamura describes a method by which the diffusion length and diffusion constant of an acid in a chemically-amplified resist can be determined. This basic physical phenomenon limits the resolving power in a chemically-amplified system which is particularly sensitive to the change in an acid latent image due to its low barrier to activation energy. The resist described by H. Röschert, et al. in "Progress in Technique and Treatment of Resists IX" edited by Anthony E. November, Proc. SPIE 1672, 33–45 (1992) has the following unfavorable properties due to the problem of diffusion when no additive is used therein:

1) resolving power is only 0.5 micron or less;
2) high resolution can be attained only by the unfavorable deflection of straightness;
3) latitude in exposure is very small; and
4) stability to delay time between exposure and post-exposure baking is extremely poor, and a drastic linewidth change undergoes in a non-exposed resist are.

SUMMARY OF THE INVENTION

An object of the present invention is to provide a novel mixture for use in the production of semiconductors, which has high sensitivity to light in the region of radiation, such as short-wavelength UV light, X-rays and electron beams, which can be developed by an aqueous alkaline solution, and which can have a stable acid latent image therein.

The above object of the invention can be attained by a radiation-sensitive mixture which comprises as essential components:

a) a binder which is insoluble in water but soluble in an aqueous alkaline solution, b$^1$) a compound having at least one bond which can be cleaved by an acid, or b$^2$) a compound having at least one bond which is crosslinked with the compound a) by an acid, c) a compound which generates an acid when irradiated, and d) a basic iodonium compound.

One compound or a mixture of two or more compounds are used as each of the above components a) to d).

In the present invention, one of the compounds represented by the general formulas I) to III):

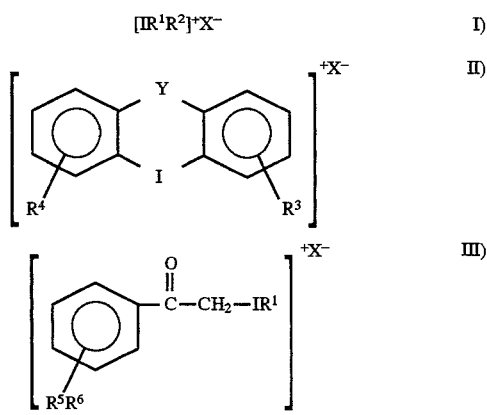

wherein
R$^1$ and R$^2$ each independently represent C$_1$–C$_{18}$ alkyl, aryl, heteroaryl, or aryl which is mono-, di- or tri-substituted by alkyl, aryl, a halogen, alkoxy, phenoxy, thiophenol, phenylsulfonyl or phenylsulphenyl;

Y represents [CH2]n where n is 0 or 1, O or S;

$R^3$ and $R^4$ represent $C_1$–$C_4$ alkyl, alkoxy or a halogen;

$R^5$ and $R^6$ represent $C_1$–$C_4$ alkyl, alkoxy or a halogen;

X is a basic anion whose pKB value is from −3 to +5; and at least one hydrogen atom of $R^1$ to $R^6$ may be substituted by X to form an inner salt; or a mixture of two or more of these compounds is preferably used as the basic iodonium compound d).

The incorporation amount of the basic iodonium compound is from 0.01 to 2.00 mol equivalent to the maximum amount of an acid which can be theoretically formed by the compound c).

All of those iodonium compounds which fulfill the following requirements are suitable:

1) fully soluble in a resist;
2) having sufficiently high thermal stability; and
3) having a basic counter ion sufficiently.

In the general formulas I) to III), particularly preferable conditions are as follows:

$R^1$ and $R^2$ each independently represent methyl, ethyl, propyl, isopropyl, butyl, phenyl, biphenyl, toluyl, xylyl, chlorophenyl, bromophenyl, methoxyphenyl, ethoxyphenyl, propyloxyphenyl, butyloxyphenyl, tert-butyloxyphenyl, phenoxyphenyl, thiophenoxyphenyl or phenylsulfonylphenyl;

Y represents $[CH_2]_n$ where n is 0 or 1, O or S;

$R^3$ and $R^4$ represent $C_1$–$C_4$ alkyl, methoxy, ethoxy, chlorine or bromine;

$R^5$ and $R^6$ represent $C_1$–$C_4$ alkyl, methoxy, ethoxy, chlorine or bromine;

X represents a hydroxyl group, $RO^-$ (R=$C_1$–$C_4$ alkyl), $RCOO^-$ (R=$C_1$–$C_{10}$ alkyl, aryl, alkylaryl) or $OCOO^-$; and at least one hydrogen atom of $R^1$ to $R^6$ may be substituted by X to form an inner salt, and X which consist of basic functional group and R may combine with $R^1$ to $R^6$ with or without interposing R between the basic functional group and one of $R^1$ to $R^6$, such as diphenyliodonium-2-carboxylate.

Onium salts such as iodonium salts and sulfonium salts are well known by technical literatures, and technically very important as photochemical polymerization catalysts. The outline of the use of onium salts in resist materials is given by Crivello in Org. Coatings and Appl. Polym. Sci., 48, pp. 65–69 (1985). The synthesis and photochemical properties of onium salts are summarized in "Cation Polymerization—Iodonium and Sulfonium Salts Photoreaction Initiators", J. V. Crivello, Progress in. Polymer Science 62, published by Springer, Heidelberg, Berlin in 1984.

Further, we have developed a method by which any iodonium hydroxide can be prepared, where compounds are prevented from being contaminated with metallic ions. This method is extremely important for applying the radiation-sensitive mixture of the present invention to the semiconductor technology. In the method, ion-exchange chromatography is used with a polar or non-polar eluent. An Amberlist-type resin having a quaternary ammonium group is preferable as an ion-exchange resin. In principle, the ion-exchange resin can be converted into a basic form by using any tetraalkylammonium solution having a basic counter ion. In particular, tetramethylammonium hydroxide is suitable. Water, an alcohol, tetrahydrofuran or a non-polar organic solvent is suitable as the eluent. Methanol or ethanol is particularly preferred.

In principle, in the preparation of an iodonium hydroxide, a corresponding halide is used. However, other anions such as metal fluorides of a complex, tetrafluoroborates and hexafluorophosphates can also be used. An iodonium salt is dissolved in a small amount of an eluent, and the solution is added on an exchanger column. Elution speed depends on the size of and load on the column. However, it is substantially lower than that in the case where a strong electrolyte is ion-exchanged by ion-exchange chromatography. This is because it takes more time to equilibrate the column to a theoretical standard than to do so when a compound is strongly dissociated in an eluent.

The base content of an eluate, which is determined by titration, agrees with a theoretical value. The titration curve of bis(t-butylphenyl)iodonium hydroxide in water/methanol containing 0.1 n HCl clearly exhibits buffer characteristics in the region of pH=7. Therefore, bis(t-butylphenyl)iodonium hydroxide is not a strong electrolyte in a solution, contrary to our expectation, but an amphoteric molecule.

The above-described method can attain an exchange rate of 93.7%. The other properties of a basic iodonium salt solution can be studied by UV spectrophotometry. The position and absorptance of the absorption maximum are not changed as compared with the non-basic iodonium salt used. Therefore, the effect of this anion on the absorption characteristics of an iodonium chromophoric group is small.

Successively, the eluent can be replaced by any other suitable solvent by evaporating it under reduced pressure.

By this method, a solution of an iodonium hydroxide in a solvent having a specific concentration, suitable for a resist formulation can be obtained.

It can be proved that the iodonium hydroxide level in the solution is constant by titrating the base content of the solution at various time intervals.

As mentioned above, the method of the present invention regarding basic iodonium salts is not limited to the production of hydroxides. Other basic or non-basic solutions can also be produced by means of ion-exchange chromatography depending upon the pKB value of the anion thereof. However, any other basic or non-basic compound can be readily obtained from hydroxides by simply adding thereto a conjugate acid.

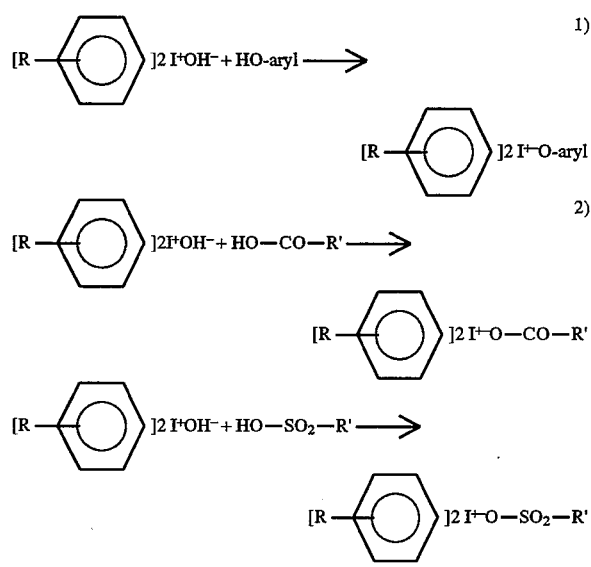

It is extremely easy to obtain iodonium salts having any anion by the above method, using a suitably-prepared ion-exchange column, or by back titration of a hydroxide solution with a corresponding conjugate acid.

The technical merits of the above method are as follows:

1) operation can be conducted in the absence of metallic ions;

2) an iodonium salt which is unstable in a separated form can be produced, and used in a radiation-sensitive mixture; and 3) an iodonium salt which cannot be produced in a pure form can be produced, and used in a radiation-sensitive mixture.

The method for producing a basic iodonium hydroxide solution according to the present invention is particularly suitable for simply producing an iodonium acetate solution by the hydrolysis of an ester. Propylene glycol monomethyl ether acetate (PGMEA) is a preferable solvent in the resist technology. When the eluent of a basic iodonium hydroxide solution is replaced by PGMEA, the ester cleavage of the solvent occurs, and is completed in a short time.

A basic anion reacts with a phenolic binder by acid-base reaction in a resist matrix to become a polyphenolate anion. An acid to be diffused in a non-exposed area is neutralized with this anion.

To our surprise, weakly-basic anions such as acetates, and ordinary carboxylic acid anions are also suitable. They have buffer action on an acid to be diffused in a non-exposed area, and do not have a catalytic action on the hydrolysis of an acetal.

By this, an acid latent image is stabilized; resolving power in lithography is improved; stability to delay time is enhanced; and operation range (latitude in exposure) is increased.

To add a basic compound to a radiation-sensitive mixture which is treated by chemical amplification is contradiction in itself because not only an acid to be diffused in a non-exposed area but also an acid which is present in an exposed area is neutralized with the base, but an acid is necessary for catalytic reaction in order to make difference in solubility.

Basic iodonium hydroxides have such technical merits as compared with non-photoactive basic additives that they are photoactive in themselves and that they are neutralized in an exposed area. For this reason, it becomes possible to add a large amount of a base to a resist without drastically decreasing the radiation sensitivity of the resist.

A binder containing a phenolic hydroxyl group is suitable as the binder a). Poly(hydroxystyrene) has high thermal stability and high resistance to etching, and is highly transparent to UV light in the 248 nm region, so that it is particularly suitable. Particularly suitable binders are poly (4-hydroxystyrene), and a copolymer of poly(4-hydroxystyrene) and alkyl-substituted 4-hydroxystyrene. In particular, copolymeric poly[4-hydroxystyrene-co-4-hydroxy-3-methylstyrene] and poly[4-hydroxystyrene-co-4-hydroxy-3,5-dimethylstyrene] are suitable. The monomer ratio can be changed between 10% and 90%. However, in order to obtain optimum dissolution characteristics, a monomer ratio of 2:1 to 1:2 is particularly preferred. For a polymer matrix, the solubility thereof to an aqueous alkaline developer is most important. The molecular weight MW of the binder is from 3000 to 100,000, preferably from 8000 to 30,000. It is necessary that the degree of dispersion of the binder be 2 or less.

The hydrophilic nature of a resist matrix is controlled by blending poly(4-hydroxystyrene) with other phenolic binder. To blend with PHS, alkyl-substituted poly (hydroxystyrene), in particular, poly(4-hydroxy-3-methylstyrene), or novolac is also suitable.

A compound having at least one C—O—C or C—N—C bond is preferably used as the compound b1) having at least one bond which can be cleaved by an acid. A compound suitable as such a compound is one represented by the general formula IV):

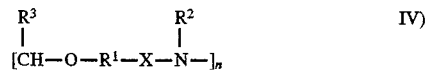

wherein $R^1$ is a $C_1$–$C_4$ alkylene group,
$R^2$ is a $C_1$–$C_4$ alkyl group,
$R^3$ is a $C_1$–$C_{10}$ alkyl group or an aryl group,
X is —CO—, —O—CO— or —NH—CO group, and
n is an integer greater than 1.

Poly-N,O-acetal which is obtained by acid-catalyst-reactive acetal exchange, using a dimethyl acetal of a corresponding aldehyde and a corresponding alcohol component is chemically important. The degree of condensation and molecular weight distribution of the poly-N,O-acetal can be controlled by the polycondensation conditions.

A compound having at least one C—O—C bond which can be crosslinked with the compound a) by an acid is preferably used as the compound $b^2$) having at least one bond which is crosslinked with the compound a) by an acid. Suitable examples of such a compound include the following compounds:

a heterocyclic aromatic compound represented by the general formula V):

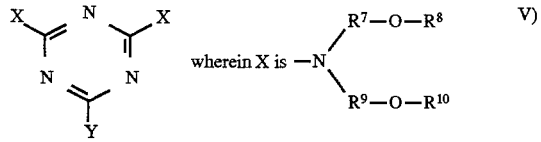

in which
$R^7$ and $R^9$ are an alkyl group, and
$R^8$ and $R^{10}$ are an alkyl group or hydrogen atom, and
Y is the same as X, or hydrogen atom, a $C_1$–$C_6$ alkyl group, a $C_5$ or $C_6$ cycloalkyl group, or a substituted or unsubstituted or oxygen-, nitrogen- or sulfur-containing $C_6$–$C_{12}$ aryl, $C_6$–$C_{12}$ aralkyl or $C_6$–$C_{12}$ acyl group;

a urethane formaldehyde resin represented by the general formula VI):

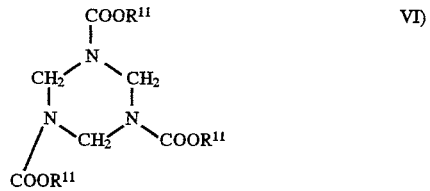

wherein $R^{11}$ is an alkyl group or hydrogen atom; and a crosslinking compound represented by the general formula VII):

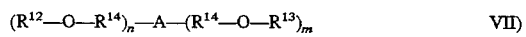

wherein
A is —B—(Z)$_p$— or —B—Z—B—, in which B is a substituted or unsubstituted, mononuclear aromatic hydrocarbon compound or heterocyclic aromatic compound containing oxygen, sulfur or nitrogen atom,
and Z is direct bond, $C_1$–$C_4$ alkylene, $C_1$–$C_9$ alkylenedioxy or a substituted or unsubstituted phenylene, in which Z may be interrupted by nitrogen atom, —NH—, —O—, —S—, —SO$_2$—, —CO—, —CO$_2$—, —OCO$_2$—, —CONH— or —O—C$_6$H$_4$O—;

$R^{12}$ and $R^{13}$ are hydrogen atom, a $C_1$–$C_6$ alkyl group, a $C_1$–$C_9$ aliphatic unsaturated carbonyl group, a $C_5$ or $C_6$ cycloalkyl group, a substituted or unsubstituted $C_6$–$C_{12}$ aryl, $C_6$–$C_{12}$ aralkyl or acyl group;

$R^{14}$ is a $C_1$–$C_4$ alkylene group in which the chain may be substituted by nitrogen atom, —O—, —CO— or —CONH—, or a substituted or unsubstituted phenyl;

n is an integer of 1 to 3;

m is an integer of 0 to 3, provided that n+m is at least 2; and p is an integer of 0 to 3.

A compound having R—O—$CH_2$—R' bond in its molecule is preferable as the crosslinking agent $b^2$), and a compound containing (R—O—$CH_2$R')—N group, represented by the general formula V) is particularly preferred.

Suitable examples of the compound c) which generates an acid include diazonium salts, iodonium salts, sulfonium salts, halogen compounds and ortho-quinonediazide-sulfonic esters. In general, the above onium salts are used in the form of salts soluble in an organic solvent; in most cases, they are used as tetrafluoroborates, hexafluorophosphates, hexafluoro-antimonates, hexafluoroarsenates, or sulfonates such as trifluoromethylsulfonate or hexafluoropropylsulfonate. Among the halogen compounds, triazine, oxazole, oxadiazole, thiazole and 2-pyrone which are substituted with a trichloromethyl group and/or a tribromomethyl group are preferred. Besides these compounds, a halogenated, in particular, chlorinated or brominated aromatic compound is also suitable as the acid-generator.

Those compounds which generate a sulfonic acid, and have high thermal stability and good absorption characteristics are preferred.

Particularly preferable compounds are phenolic sulfonic esters, bissulfonylmethanes and alpha,alpha-bissulfonyl-diazomethanes represented by the general formula VIII)

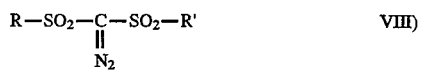

wherein R and R' each independently represent an alkyl, cycloalkyl, aryl or heteroaryl group. This is because these compounds have high acid-generation efficiency and are highly transparent to light in the DUV region.

Further, for the irradiation of X-rays or electron beams, diaryl iodonium salts which have high acid-generation efficiency are preferred. The above iodonium-sulfonic acid salt can be obtained, for example, by adding a sulfonic acid to a basic iodonium salt solution. More specifically, bis(t-butylphenyliodonium)sulfonate and the like can be mentioned. Examples of the sulfonic acid which can be used herein include alkyl sulfonic acids, partially- or fully-fluorinated alkyl sulfonic acids, aryl sulfonic acids, and arylsulfonic acids substituted with a halogen, or an alkyl, alkoxy, nitro, cyano or alkyl halide group. The incorporation amount of the compound c) is from 1 to 10% by weight of the total weight of the solid components incorporated. There may be a case where a mixture of two or more photoactive compounds shows advantageous characteristics in a resist.

The mixture of the present invention, comprising the components a) to d) is dissolved in an organic solvent. At this time, the solid content is generally controlled to the range of 5 to 40% by weight. An aliphatic ketone, ether or ester, or any mixture thereof is preferable as the solvent. Particularly preferable solvents are alkylene glycol monoalkyl ethers such as 1-methoxy-2-propanol, and alkylene glycol alkyl ether esters such as 1-methoxy-2-propanol-acetate (PGMEA).

Other additives such as an adhesion-promoting agent, a crosslinking agent, a colorant and a plasticizer can be further added to the mixture.

In order to make the acid-generator sensitive to from long-wavelength UV light to visible light, a small amount of a sensitizer may be added, if desired. A polycyclic aromatic compound such as pyrene or perylene is preferably used as the sensitizer. A dye which acts as a sensitizer can also be used.

The photoresist solution containing the radiation-sensitive mixture of the present invention is spin-coated onto a suitable substrate, for example, a bare silicon wafer so as to form a resist layer having a thickness of generally 0.1 to 5 micron, preferably 0.5 to 1.5 micron, and then dried (for instance, at a temperature of 70° to 130° C.). The resist layer is exposed imagewise to light from a suitable light source through a photomask. After this imagewise exposure, the resist layer is subjected to baking treatment (post-exposure baking) at 40° to 130° C. for 180 to 30 seconds. The photoresist is developed by an alkaline developer which preferably contains no metallic ion, for instance, an aqueous tetramethylammonium hydroxide solution. In the case where an aqueous tetramethyl-ammonium hydroxide solution is used, the concentration thereof is preferably from 1.0 to 4.0% by weight. The resolution is in the range of less than 0.5 micron. The deep UV irradiation energy required for the radiation-sensitive mixture of the present invention is, in general, from 5 to 100 $mJ/cm^2$.

The developed resist pattern layer may be post-cured, if desired. This treatment is generally conducted by heating, on a hot plate, the resist pattern layer to a temperature lower than the flow temperature thereof, and then exposing the entire surface of the layer to light from a xenon-mercury vapor lamp (200–250 nm region). By this post-curing treatment, the resist pattern layer is crosslinked, and thus imparted with flow resistance which is effective, in general, at a temperature of 200° C. or lower.

The preferable use of the radiation-sensitive mixture of the present invention is a resist material used for producing integrated circuits or various electronic parts. In this production process, a recording material produced by using the mixture can be used as a mask in the subsequent step. Thereafter, for example, the etching of the substrate on which the resist layer is provided, the implantation of ions into the substrate, or the separation of the metal is conducted. Besides the above use, the radiation-sensitive mixture of the present invention is suitable for the production of litho printing plates. Method for preparing propylene glycol monomethyl ether acetate (PGMEA) solution of bis(t-butylphenyl)iodonium hydroxide:

A column having a length of 55 cm and an inside diameter of 5 cm is filled with 700 g of Amberlist A-26 in the form of chloride. For this purpose, the resin is dispersed in methanol, and the resulting dispersion is poured into the column. 3 liter of methanol is added to 3 liter of a 0.54N solution of tetramethylammonium hydroxide. The resin filled in the column is converted into the form of hydroxide by using this alkaline solution.

The column is washed with 3 liter of methanol until the pH of the washing becomes neutral. 1.8 mmol (1.0 g) of bis(t-butylphenyl)iodonium trifluorate is dissolved in a small amount of methanol, and the solution is added on the column. The elution speed is 30 ml/h. The elution is monitored by measuring potential difference or UV absorption. The base content is measured by titration using 0.1N HCl. The result of a bromine ion test using silver nitrate is negative. By the measurement of the base content, the exchange rate was found to be 93.7%. The methanol is evaporated in a rotary evaporator under reduced pressure. Successively, the resultant is substituted with PGMEA until a 0.1 mmol/g PGMEA solution of bis(t-butylphenyl) iodonium hydroxide (BPIH) is finally obtained. Even when the methanol is replaced with propylene glycol monomethyl ether, the BPIH concentration of the solution is not changed. A solution of diphenyl iodonium hydroxide and that of 4-methoxydiphenyl iodonium hydroxide were prepared by the same method.

EXAMPLES

The following starting materials were used in the following Examples.

Polymer A:
Poly[4-hydroxystyrene-co-4-hydroxy-3-methylstyrene] (2:1 copolymer)
$M_W$=14000 g/mol, $M_N$=7000 g/mol
Optical density (248 nm)=0.18/μm-1
Poly-N,O-acetal B:
$R^1$=n-propyl,
$R^2$=ethylene,
$R^3$=aryl,
X=O—CO—.
n: $M_W$=2500 mol/g, $M_W M_N$>2.5
Photoactive compound C:
Bis(4-chlorophenylsulfonyl)diazomethane
Photoactive compound D:
Bis(4-t-butylphenyl)iodonium triflate
Photoactive compound E:
Triphenylsulfonium triflate
Photoactive compound F:
Tribromomethyl phenyl sulfone
Solvent: 1-Methoxy-propyleneglycol-2-acetate (PGMEA)

The components of a radiation-sensitive mixture to be tested are expressed in parts by weight.

Examples 1 and 6

A radiation-sensitive mixture having the following formulation was prepared. In Example 6, 0.02 part of Photoactive compound D was further added to the formulation:

| | |
|---|---|
| Polymer A | 1.40 parts by weight |
| Poly-N,O-acetal B | 0.70 part by weight |
| Photoactive compound C | 0.04 part by weight |
| PGMEA | 8.00 parts by weight |

This solution was filtered through a 0.2 micron filter, and then spin-coated onto a silicon wafer which had been pre-treated by hexamethyldisilazane serving as an adhesion promoting agent, thereby forming a uniform layer having a thickness of 1 micron. The wafer was dried (soft baking) on a hot plate at 120° C. for 60 seconds, and then subjected to imagewise exposure. This exposure was conducted by using a 248 nm KrF excimer laser with a Nikon excimer stepper having a numerical aperture of 0.50 and test masks having various pattern sizes. The delay time between the exposure and the baking conducted after the exposure (post-exposure baking, PEB), and the delay time between the baking and the development are important process parameters. In this experiment, these delay times were kept shorter than 2 minutes, unless otherwise indicated. The post-exposure baking was normally conducted at 60° C. for 60 seconds. The wafer exposed was developed by immersing it in a 2.38 wt. % (0.265N) tetramethylammonium hydroxide solution. The result of litho printing was evaluated by the resolution of 1:1 line and space (resolution maintaining linearity) attained.

In a delay time test, the delay time between the exposure and the PEB was changed, and the development was conducted right after the PEB. The results obtained were evaluated by the loss (slimming) in line width, which is the relative line width of the obtained pattern to that of the pattern obtained by applying the same dose without giving delay time.

These examples are summarized in the following table. It is noted that "PAC" in the table means a photoactive compound.

TABLE 1

| Example No. | PAC 1 Parts by weight | PAC 2 Parts by weight | Basic iodonium additive as 0.1 mmol/g solution in PGMEA | Iodonium additive concentration to total PAC concentration (mol/mol %) | 1:1 dose required to obtain maximum line-resolution (mJ/cm$^2$) Maximum line-resolution (μm) | Loss (%) in line width when delay time between exposure and PEB is 30 min. (0.5 μm design) |
|---|---|---|---|---|---|---|
| 1 | C 2 | none | none | none | 18 0.45 | 50 |
| 2 | C 2 | none | Bis(4-tert-butyl-phenyl) iodonium hydroxide | 20 | 19 0.36 | 17 |
| 3 | C 2 | none | Bis(4-tert-butyl-phenyl) iodonium hydroxide | 40 | 20 0.34 | 13 |
| 4 | C 2 | none | Bis(4-tert-butyl-phenyl) iodpnium hydroxide | 50 | 24 0.32 | 9 |
| 5 | C 2 | none | Bis(4-tert-butyl-phenyl) | 60 | 30 0.34 | 8 |

TABLE 1-continued

| Example No. | PAC 1 Parts by weight | PAC 2 Parts by weight | Basic iodonium additive as 0.1 mmol/g solution in PGMEA | Iodonium additive concentration to total PAC concentration (mol/mol %) | 1:1 dose required to obtain maximum line-resolution (mJ/cm$^2$) Maximum line-resolution (μm) | Loss (%) in line width when delay time between exposure and PEB is 30 min. (0.5 μm design) |
|---|---|---|---|---|---|---|
| 6 | C 2 | D 1 | iodonium hydroxide Bis(4-tert-butyl-phenyl) iodonium hydroxide | 50 | 14 0.30 | 9 |

Example 7

A radiation-sensitive mixture having the following formulation was prepared:

| | |
|---|---|
| Polyhydroxystyrene of which the phenolic OH group was substituted by 40% with a tert-butyloxycarbonyl group | 2.00 parts by weight |
| Photoactive compound E | 0.05 part by weight |
| PGMEA | 8.00 parts by weight |
| BPIH as 0.1 mmol/9 PGMEA solution (50% by mole based on the amount of compound E in the resist) | 50% |

This solution was filtered through a 0.2 micron filter, and then spin-coated onto a silicon wafer which had been pre-treated by hexamethyldisilazane serving as an adhesion promoting agent, thereby forming a uniform layer having a thickness of 1 micron. The wafer was dried (soft baking) on a hot plate at 120° C. for 60 seconds, and then subjected to imagewise exposure. This exposure was conducted by using a 248 nm KrF excimer laser with a Nikon excimer stepper having a numerical aperture of 0.55 and test masks having various pattern sizes. The delay time between the exposure and the baking conducted after the exposure (post-exposure baking, PEB), and the delay time between the baking and the development are important process parameters. In this experiment, these delay times were kept shorter than 2 minutes, unless otherwise indicated. The post-exposure baking was normally conducted at 90° C. for 60 seconds. The wafer exposed was developed by immersing it in tetramethylammonium hydroxide solution(0.15N). The resolution of the resist material was evaluated in the same manner as that of the above examples. As a result, it has been found that the same improvement as attained in the above examples could be attained.

Example 8

A radiation-sensitive mixture having the following formulation was prepared:

| | |
|---|---|
| Polyhydroxystyrene of which the phenolic OH group was substituted by 40% with silanol group | 2.00 parts by weight |
| Photoactive compound E | 0.05 part by weight |
| PGMEA | 8.00 parts by weight |
| BPIH as 0.1 mmol/9 PGMEA solution (50% by mole based on the amount of compound E in the resist) | 50% |

This solution was filtered through a 0.2 micron filter, and then spin-coated onto a silicon wafer which had been pre-treated by hexamethyldisilazane serving as an adhesion promoting agent, thereby forming a uniform layer having a thickness of 1 micron. The wafer was dried (soft baking) on a hot plate at 120° C. for 60 seconds, and then subjected to imagewise exposure. This exposure was conducted by using a 248 nm KrF excimer laser with a Nikon excimer stepper having a numerical aperture of 0.50 and test masks having various pattern sizes. The delay time between the exposure and the baking conducted after the exposure (post-exposure baking, PEB), and the delay time between the baking and the development are important process parameters. In this experiment, these delay times were kept shorter than 2 minutes, unless otherwise indicated. The post-exposure baking was normally conducted at 70° C. for 60 seconds. The wafer exposed was developed by immersing it in tetramethylammonium hydroxide solution(0.15N). The resolution of the resist material was evaluated in the same manner as that of the above examples. As a result, it has been found that the same improvement as attained in the above examples could be attained.

Example 9

A radiation-sensitive mixture having the following formulation was prepared:

| | |
|---|---|
| Polyhydroxystyrene of which the phenolic OH group was substituted by 40% with tetrahydro-pyranyl group | 2.00 parts by weight |
| Photoactive compound E | 0.05 part by weight |
| PGMEA | 8.00 parts by weight |
| BPIH as 0.1 mmol/g PGMEA solution | 50% |

(50% by mole based on the
amount of compound E in
the resist)

This solution was filtered through a 0.2 micron filter, and then spin-coated onto a silicon wafer which had been pre-treated by hexamethyldisilazane serving as an adhesion promoting agent, thereby forming a uniform layer having a thickness of 1 micron. The wafer was dried (soft baking) on a hot plate at 120° C. for 60 seconds, and then subjected to imagewise exposure. This exposure was conducted by using a 248 nm KrF excimer laser with a Nikon excimer stepper having a numerical aperture of 0.50 and test masks having various pattern sizes. The delay time between the exposure and the baking conducted after the exposure (post-exposure baking, PEB), and the delay time between the baking and the development are important process parameters. In this experiment, these delay times were kept shorter than 2 minutes, unless otherwise indicated. The post-exposure baking was normally conducted at 70° C. for 60 seconds. The wafer exposed was developed by immersing it in tetramethylammonium hydroxide solution(0.15N). The resolution of the resist material was evaluated in the same manner as that of the above examples. As a result, it has been found that the same improvement as attained in the above examples could be attained.

Example 10

A radiation-sensitive mixture having the following formulation was prepared:

| | |
|---|---|
| Polyhydroxystyrene of which the phenolic OH group was substituted by 40% with tert-butyl ester group | 2.00 parts by weight |
| Photoactive compound E | 0.05 part by weight |
| PGMEA | 8.00 parts by weight |
| BPIH as 0.1 mmol/g PGMEA solution (50% by mole based on the amount of compound E in the resist) | 50% |

This solution was filtered through a 0.2 micron filter, and then spin-coated onto a silicon wafer which had been pre-treated by hexamethyldisilazane serving as an adhesion promoting agent, thereby forming a uniform layer having a thickness of 1 micron. The wafer was dried (soft baking) on a hot plate at 120° C. for 60 seconds, and then subjected to imagewise exposure. This exposure was conducted by using a 248 nm KrF excimer laser with a Nikon excimer stepper having a numerical aperture of 0.50 and test masks having various pattern sizes. The delay time between the exposure and the baking conducted after the exposure (post-exposure baking, PEB), and the delay time between the baking and the development are important process parameters. In this experiment, these delay times were kept shorter than 2 minutes, unless otherwise indicated. The post-exposure baking was normally conducted at 90° C. for 60 seconds. The wafer exposed was developed by immersing it in tetramethylammonium hydroxide solution(0.15N). The resolution of the resist material was evaluated in the same manner as that of the above examples. As a result, it has been found that the same improvement as attained in the above examples could be attained.

Example 11

A negative radiation-sensitive mixture having the following formulation was prepared:

| | |
|---|---|
| Poly(3-methoxymethyl-4-hydroxystyrene) | 1.60 parts by weight |
| hexamethoxymethyl melamine | 0.4 part by weight |
| Photoactive compound D | 0.02 part by weight |
| PGMEA | 8.00 parts by weight |
| BPIH as 0.1 mmol/g PGMEA solution (50% by mole based on the amount of compound D in the resist) | 50% |

This solution was filtered through a 0.2 micron filter, and then spin-coated onto a silicon wafer which had been pre-treated by hexamethyldisilazane serving as an adhesion promoting agent, thereby forming a uniform layer having a thickness of 1 micron. The wafer was dried (soft baking) on a hot plate at 110° C. for 60 seconds, and then subjected to imagewise exposure. This exposure was conducted by using a 248 nm KrF excimer laser with a Nikon excimer stepper having a numerical aperture of 0.50 and test masks having various pattern sizes. The delay time between the exposure and the baking conducted after the exposure (post-exposure baking, PEB), and the delay time between the baking and the development are important process parameters. In this experiment, these delay times were kept shorter than 2 minutes, unless otherwise indicated. The post-exposure baking was normally conducted at 105° C. for 120 seconds. The wafer exposed was developed by immersing it in tetramethylammonium hydroxide solution(0.26N). The resolution of the resist material was evaluated in the same manner As that of the above examples of the positive resist. As a result, it has been found that the resolution of 1:1 line and space maintaining linearity was 0.30 μm.

Comparative Example 1

The procedure of Example 11 was repeated except that BPIH was not added, whereby negative resist mixture was obtained. As a result of evaluation of the resolution of the resist material in the same manner as that of Example 11, it has been found that the resolution of 1:1 line and space maintaining linearity was 0.4 μm.

Example 12

The procedure of Example 11 was repeated except that Photoactive compound E was used in place of Photoactive compound D, whereby a negative resist mixture was obtained. As a result of evaluation of the resolution of the resist material in the same manner as that of Example 11, it has been found that the resolution of 1:1 line and space maintaining linearity was 0.3 μm.

Comparative Example 2

The procedure of Example 12 was repeated except that BPIH was not added, whereby negative resist mixture was obtained. As a result of evaluation of the resolution of the resist material in the same manner as that of Example 12, it has been found that the resolution of 1:1 line and space maintaining linearity was 0.4 μm.

The following are preferable embodiments of the present invention:

1. A positive-type radiation-sensitive mixture, wherein the previously-described compound b$^1$) is a compound having at least one C—O—C or C—N—C bond which can be cleaved by an acid.

2. A negative-type radiation-sensitive mixture, wherein the compound b²) is a compound having at least one C—O—C bond which can be crosslinked with the compound a) by an acid.

3. The radiation-sensitive mixture described in the above 1 or 2, characterized in that the amount of the basic iodonium compound d) is from 0.01 to 2.00 mol equivalent to the maximum amount of an acid which can be theoretically formed by the compound c).

4. The radiation-sensitive mixture described in any one of the above 1 to 3, wherein the diffusion of an acid produced by radiation, and the progress of dark reaction caused by the acid diffusion are controlled by neutralizing the acid with the basic iodonium salt.

5. The radiation-sensitive mixture described in any one of the above 1 to 4, characterized in that the basic iodonium compound d) is one of the compounds represented by the following formulas I) to III):

$$[IR^1R^2]^+X^-  \quad\quad I)$$

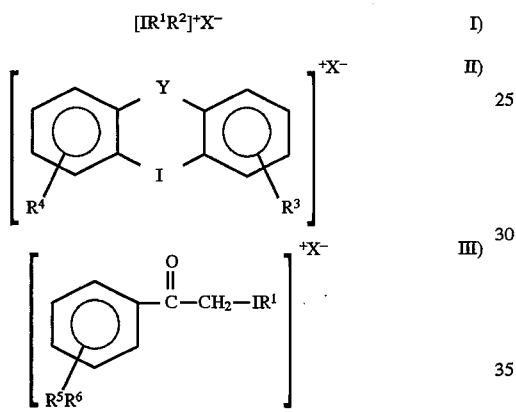

wherein $R^1$ and $R^2$ each independently represent $C_1$–$C_{18}$ alkyl, aryl, heteroaryl, or aryl which is mono-, di- or tri-substituted by alkyl, alkylaryl, aryl, a halogen, alkoxy, phenoxy, thiophenol, phenylsulfonyl or phenylsulphenyl;

Y represents $[CH_2]_n$ where n is 0 or 10 or S;

$R^3$ and $R^4$ represent $C_1$–$C_4$ alkyl, alkoxy or a halogen;

$R^5$ and $R^6$ represent $C_1$–$C_4$ alkyl, alkoxy or a halogen;

X is a basic anion whose pKB value is from −3 to +5; and at least one hydrogen atom of $R^1$ to $R^6$ may be substituted by X to form an inner salt; or a mixture of two or more of these compounds.

6. The radiation-sensitive mixture described in the above 5, characterized in that the mixture fulfills the following conditions:

$R^1$ and $R^2$ each independently represent methyl, ethyl, propyl, isopropyl, butyl, phenyl, benzylbiphenyl, toluyl, xylyl, chlorophenyl, bromophenyl, methoxyphenyl, ethoxyphenyl, propyloxyphenyl, butyloxyphenyl, tert-butyloxyphenyl, phenoxyphenyl, thiophenoxyphenyl or phenylsulfonylphenyl;

Y represents $[CH_2]_n$ where n is 0 or 1, O or S;

$R^3$ and $R^4$ represent $C_1$–$C_4$ alkyl, methoxy, ethoxy, chlorine or bromine;

$R^5$ and $R^6$ represent $C_1$–$C_4$ alkyl, methoxy, ethoxy, chlorine or bromine;

X represents a hydroxyl group, RO⁻ (R=$C_1$–$C_4$ alkyl), RCOO⁻ (R=$C_1$–$C_{10}$ alkyl, aryl, alkylaryl) or OCOO⁻; and at least one hydrogen atom of $R^1$ to $R^6$ may be substituted by X to form an inner salt, and X which consist of basic functional group and R may combine with $R^1$ to $R^6$ with or without interposing R.

7. The radiation-sensitive mixture described in any one of the above 1 to 6, characterized in that the binder a) contains a phenolic hydroxyl group.

8. The radiation-sensitive mixture described in any one of the above 1 to 7, characterized in that the binder a) is poly(hydroxystyrene), alkyl-substituted poly(hydroxystyrene) or a copolymer thereof.

9. The radiation-sensitive mixture described in any one of the above 1 to 8, characterized in that the binder a) further contains one phenolic binder other than the poly(hydroxystyrene).

10. The radiation-sensitive mixture described in any one of the above 1 to 9, characterized in that the compound b1) is represented by the general formula IV):

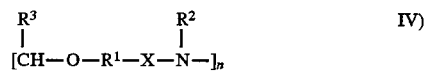

wherein $R^1$ is a $C_1$–$C_4$ alkylene group,
$R^2$ is a $C_1$–$C_4$ alkyl group,
$R^3$ is a $C_1$–$C_{10}$ alkyl group or an aryl group,
X is —CO—, —O—CO— or —NH—CO, and
n is an integer greater than 1.

11. The radiation-sensitive mixture described in the above 10, characterized by comprising 1 to 60% by weight of compound b1).

12. The radiation-sensitive mixture described in any one of the above 1 to 9, characterized in that the compound b2) is represented by the following general formula V):

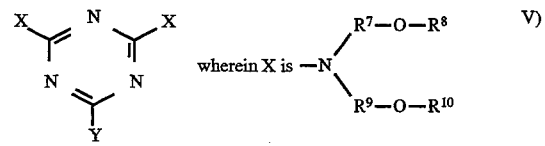

in which
$R^7$ and $R^9$ are an alkyl group, and
$R^8$ and $R^{10}$ are an alkyl group or hydrogen atom, and
Y is the same as the definition of X, or hydrogen atom, a $C_1$–$C_6$ alkyl group, a $C_5$ or $C_6$ cycloalkyl group, a $C_6$–$C_{12}$ aryl group, a $C_6$–$C_{12}$ aralkyl group or a $C_6$–$C_{12}$ acyl group, and bonded with a triazine ring directly or through —O—, —NH— or —S—, provided that the carbon atoms in the above cycloalkyl group, aryl group, aralkyl group and acyl group may be substituted by oxygen atom, nitrogen atom or sulfur atom.

13. The negative-type radiation-sensitive mixture described in the above 12, characterized by comprising 1 to 50% by weight of the compound b²).

14. The radiation-sensitive mixture described in any one of the above 1 to 11, characterized in that the compound c) is decomposed by light or radiation to form a sulfonic acid.

15. The radiation-sensitive mixture described in any one of the above 1 to 14, characterized in that the compound c) is an alpha,alpha-bis-sulfonyldiazomethane derivative represented by the general formula VIII):

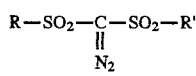

wherein R and R' are an alkyl, cycloalkyl, aryl or heteroaryl group.

16. The radiation-sensitive mixture described in any one of the above 1 to 15, characterized in that the compound c) is the alpha,alpha-bis-sulfonylmethane derivative or a phenolic sulfonic ester.

17. The radiation-sensitive mixture described in any one of the above 1 to 16, characterized by comprising 1 to 10% by weight of the compound c).

What is claimed is:

1. A positive-working radiation-sensitive mixture comprising in admixture a) a binder which is insoluble in water but soluble in an aqueous alkaline solution, $b^1$) a compound having at least one bond which can be cleaved by an acid, c) a compound which generates an acid when irradiated, and d) a basic iodonium compound.

2. A negative-working radiation-sensitive mixture comprising in admixture a) a binder which is insoluble in water but soluble in an aqueous alkaline solution, $b^2$) a compound having at least one bond which is crosslinked with the compound a) by an acid, c) a compound which generates an acid when irradiated, and d) a basic iodonium compound.

3. The radiation-sensitive mixture according to claim 1, wherein the compound c) is an iodonium-sulfonic acid salt obtained by adding a sulfonic acid to a solution of a basic iodonium salt.

4. The radiation-sensitive mixture according to claim 2, wherein the compound c) is an iodonium-sulfonic acid salt obtained by adding a sulfonic acid to a solution of a basic iodonium salt.

5. The radiation-sensitive mixture according to claim 3, wherein the sulfonic acid is an alkylsulfonic acid, a partially- or fully-fluorinated alkylsulfonic acid, an arylsulfonic acid, or an arylsulfonic acid substituted by a halogen, alkyl, alkoxy, nitro, cyano or alkyl halide group.

6. The radiation-sensitive mixture according to claim 4, wherein the sulfonic acid is an alkylsulfonic acid, a partially- or fully-fluorinated alkylsulfonic acid, an arylsulfonic acid, or an arylsulfonic acid substituted by a halogen, alkyl, alkoxy, nitro, cyano or alkyl halide group.

7. The radiation-sensitive mixture according to claim 1, wherein the amount of the basic iodonium compound d) is from 0.01 to 2.00 mol equivalent to the maximum amount of an acid which can be theoretically formed by the compound c).

8. The radiation-sensitive mixture according to claim 2, wherein the amount of the basic iodonium compound d) is from 0.01 to 2.00 mol equivalent to the maximum amount of an acid which can be theoretically formed by the compound c).

9. The radiation-sensitive mixture according to claim 1, wherein the diffusion of an acid produced by radiation, and the progress of dark reaction caused by the acid diffusion are controlled by neutralizing the acid with the basic iodonium salt.

10. The radiation-sensitive mixture according to claim 2, wherein the diffusion of an acid produced by radiation, and the progress of dark reaction caused by the acid diffusion are controlled by neutralizing the acid with the basic iodonium salt.

11. The radiation-sensitive mixture according to claim 1, wherein the basic iodonium compound d) is one of the compounds represented by the following formulas I) to III):

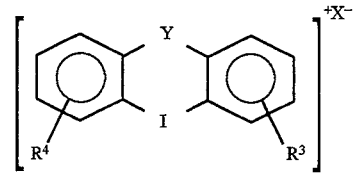

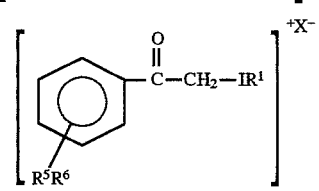

wherein $R^1$ and $R^2$ each independently represent $C_1-C_{18}$ alkyl, aryl, heteroaryl, or aryl which is mono-, di- or tri-substituted by alkyl, alkylaryl, aryl, a halogen, alkoxy, phenoxy, thiophenol, phenylsulfonyl or phenylsulphenyl;

Y represents $[CH_2]_n$ where n is 0 or 1, O or S;

$R^3$ and $R^4$ represent $C_1-C_4$ alkyl, alkoxy or a halogen;

$R^5$ and $R^6$ represent $C_1-C_4$ alkyl, alkoxy or a halogen;

X is a basic anion whose pKB value is from −3 to +5; and at least one hydrogen atom of $R^1$ to $R^6$ may be substituted by X to form an inner salt; or a mixture of two or more of these compounds.

12. The radiation-sensitive mixture according to claim 2, wherein the basic iodonium compound d) is one of the compounds represented by the following formulas I) to III):

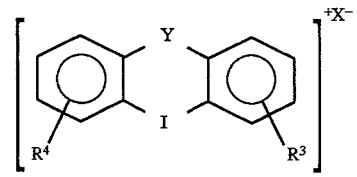

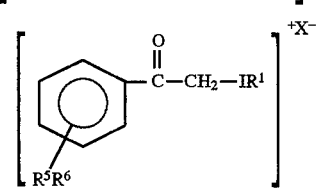

wherein $R^1$ and $R^2$ each independently represent $C_1-C_{18}$ alkyl, aryl, heteroaryl, or aryl which is mono-, di- or tri-substituted by alkyl, alkylaryl, aryl, a halogen, alkoxy, phenoxy, thiophenol, phenylsulfonyl or phenylsulphenyl;

Y represents $[CH_2]_n$ where n is 0 or 1, O or S;

$R^3$ and $R^4$ represent $C_1-C_4$ alkyl, alkoxy or a halogen;

$R^5$ and $R^6$ represent $C_1-C_4$ alkyl, alkoxy or a halogen;

X is a basic anion whose pKB value is from −3 to +5; and at least one hydrogen atom of $R^1$ to $R^6$ may be substituted by X to form an inner salt; or a mixture of two or more of these compounds.

13. The radiation-sensitive mixture according to claim 11, wherein $R^1$ and $R^2$ each independently represent methyl, ethyl, propyl, isopropyl, butyl, phenyl, benzylbiphenyl, toluyl, xylyl, chlorophenyl, bromophenyl, methoxyphenyl, ethoxyphenyl, propyloxyphenyl, butyloxyphenyl, tert-butyloxyphenyl, phenoxyphenyl, thiophenoxyphenyl or phenylsulfonylphenyl;

Y represents $[CH_2]_n$ where n is 0 or 1, O or S;

$R^3$ and $R^4$ represent $C_1$–$C_4$ alkyl, methoxy, ethoxy, chlorine or bromine;

$R^5$ and $R^6$ represent $C_1$–$C_4$ alkyl, methoxy, ethoxy, chlorine or bromine;

X represents a hydroxyl group, $RO^-$ (R=$C_1$–$C_4$ alkyl), $RCOO^-$ (R=$C_1$–$C_{10}$ alkyl, aryl, alkylaryl) or $OCOO^-$; and at least one hydrogen atom of $R^1$ to $R^6$ may be substituted by X to form an inner salt, and X which consist of basic functional group and R may combine with $R^1$ to $R^6$ with or without interposing R.

14. The radiation-sensitive mixture according to claim 12, wherein $R^1$ and $R^2$ each independently represent methyl, ethyl, propyl, isopropyl, butyl, phenyl, benzylbiphenyl, toluyl, xylyl, chlorophenyl, bromophenyl, methoxyphenyl, ethoxyphenyl, propyloxyphenyl, butyloxyphenyl, tert-butyloxyphenyl, phenoxyphenyl, thiophenoxyphenyl or phenylsulfonylphenyl;

Y represents $[CH_2]_n$ where n is 0 or 1, O or S;

$R^3$ and $R^4$ represent $C_1$–$C_4$ alkyl, methoxy, ethoxy, chlorine or bromine;

$R^5$ and $R^6$ represent $C_1$–$C_4$ alkyl, methoxy, ethoxy, chlorine or bromine;

X represents a hydroxyl group, $RO^-$ (R=$C_1$–$C_4$ alkyl), $RCOO^-$ (R=$C_1$–$C_{10}$ alkyl, aryl, alkylaryl) or $OCOO^-$; and at least one hydrogen atom of $R^1$ to $R^6$ may be substituted by X to form an inner salt, and X which consist of basic functional group and R may combine with $R^1$ to $R^6$ with or without interposing R.

15. A radiation-sensitive recording material comprising a substrate, and a radiation-sensitive layer provided thereon, where the radiation-sensitive layer comprises a radiation-sensitive mixture according to claim 1.

16. A radiation-sensitive recording material comprising a substrate, and a radiation-sensitive layer provided thereon, where the radiation-sensitive layer comprises a radiation-sensitive mixture according to claim 2.

* * * * *